(12) United States Patent
Blatchford, Jr. et al.

(10) Patent No.: US 6,200,734 B1
(45) Date of Patent: Mar. 13, 2001

(54) METHOD FOR FABRICATING SEMICONDUCTOR DEVICES

(75) Inventors: James W. Blatchford, Jr., Orlando; Brittin Charles Kane, Clermont; Kurt George Steiner, Orlando, all of FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/094,920

(22) Filed: Jun. 15, 1998

(51) Int. Cl.[7] ....................................................... G03F 7/00
(52) U.S. Cl. ............................................. 430/313; 430/950
(58) Field of Search .................... 430/311, 312, 430/313, 314, 316, 317, 318, 322, 323, 950

(56) References Cited

U.S. PATENT DOCUMENTS

| | | | |
|---|---|---|---|
| 5,580,701 | * 12/1996 | Lur et al. | 430/316 |
| 5,674,356 | * 10/1997 | Nagayama | 156/659 |
| 5,719,072 | * 2/1998 | Sugiura et al. | 437/195 |
| 5,733,712 | * 3/1998 | Tanaka et al. | 430/314 |
| 5,747,388 | * 5/1998 | Kusters et al. | 438/723 |
| 5,759,746 | * 6/1998 | Azuma et al. | 430/313 |

* cited by examiner

Primary Examiner—Kathleen Duda

(57) ABSTRACT

The invention is a method for forming semiconductor devices from a substrate having a non-planar surface. An anti-reflection coating is formed between the substrate and photoresist layer to alleviate the problems caused by non-uniform reflection at the substrate surface during exposure of the photoresist layer. Three-layer and two-layer stacks are described for use with UV and i-line exposure.

14 Claims, 1 Drawing Sheet

METHOD FOR FABRICATING SEMICONDUCTOR DEVICES

FIELD OF THE INVENTION

This invention relates to semiconductor devices, and in particular to the fabrication of semiconductor devices in integrated circuits using photolithography.

BACKGROUND OF THE INVENTION

The use of photolithography in the fabrication of semiconductor integrated circuits is well-established in the industry. Such techniques involve covering the semiconductor substrate with a photoresist material, exposing the photoresist to light through a mask including a desired pattern, and developing the photoresist so that the pattern is formed in the resist. The semiconductor can then be etched or materials deposited using the photoresist as a mask.

One of the challenges in this technology is to control feature sizes in the photoresist when the semiconductor substrate has a varying topology. For example, photoresist material is often formed over an existing gate oxide pattern on the substrate. Light incident on the photoresist which is reflected by the gate over thicker portions of oxide will travel a shorter distance than light reflected by the thinner oxide portions. These reflected rays, therefore, will form different interference patterns with light reflected by the top of the photoresist layer, thereby causing a variation in the intensity of light exposing the photoresist. The variations in exposure cause variations in the dimensions of the features defined by the photoresist.

One recent proposal for solving these problems involves forming an anti-reflection coating having a variable index of refraction over the semiconductor substrate. In one embodiment, the anti-reflection coating is made of a silicon-containing oxide with the index of refraction varied by varying the amount of silicon relative to the amount of oxide. (See U.S. Patent Application of Cirelli and Weber, Ser. No. 08/611595, filed on Mar. 7, 1996, now abandoned which is incorporated by reference herein.)

Building on this teaching, what is desired are anti-reflection coating stacks which provide optimum reflectivity control for various circuit topologies.

SUMMARY OF THE INVENTION

The invention is a method of fabricating semiconductor devices which includes the step of forming an anti-reflection coating on a substrate having a non-planar surface. The anti-reflection coating includes at least two layers of a silicon-containing oxide having different ratios of silicon-to-oxide, which will produce different indices of refraction, and different extinction coefficients. A layer of energy-sensitive material is formed over the coating and exposed to radiation to introduce a patterned image into the energy-sensitive material. A first oxide layer adjacent to the substrate has an extinction coefficient in the range 0.7 to 1.9 as measured at the exposure wavelength, and a second oxide layer adjacent to the energy-sensitive material has an index of refraction within the range 1.7 to 2.0 as measured at the exp wavelength.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
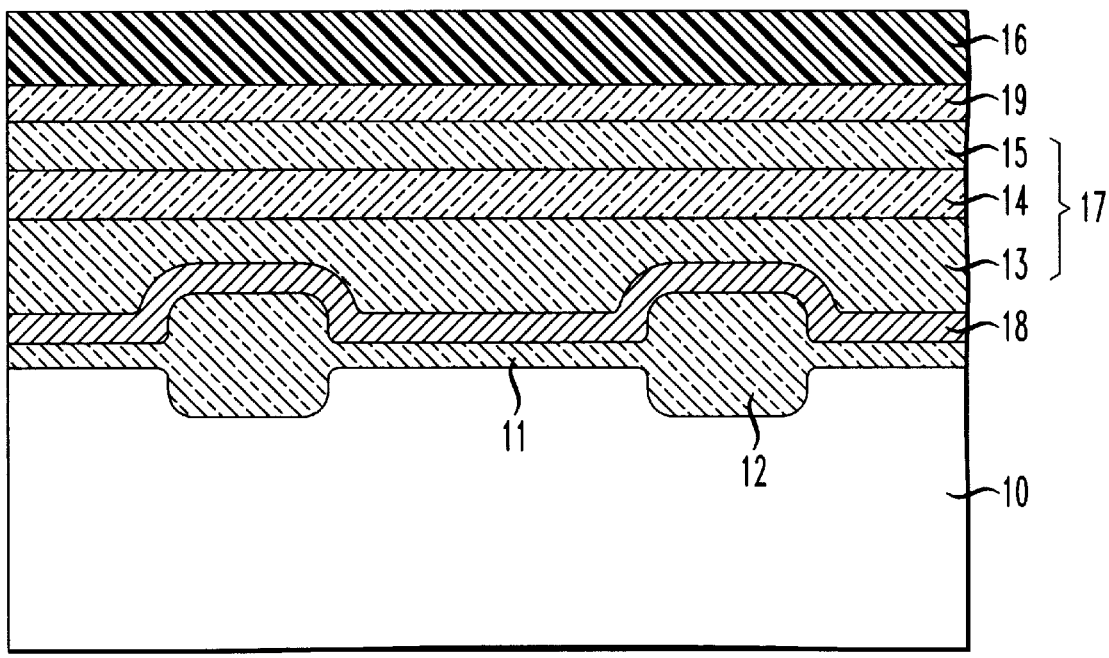
FIG. 1 is a cross-sectional view of a portion of a semiconductor wafer including an anti-reflection coating in accordance with an embodiment of the invention.

FIG. 1 illustrates a portion of a semiconductor substrate, 10, such as silicon, which is utilized to fabricate semiconductor devices Such as those normally found in integrated circuits. Formed over the substrate, 10, are areas of thin oxide, 11, and areas of thick oxide, 12, (also known as field oxide). Formed over the oxide portions is a layer of metal, 18, such as tungsten-doped polysilicon, which ultimately will be patterned to form gate electrodes in MOSFET devices (not shown). Due to the presence of the thin and thick oxide portions, a non-planar surface is formed which creates undesired interference patterns when an energy-sensitive material such as a photoresist layer, 16, is formed over the substrate and exposed to light to create a pattern in the layer, 16. The use of the gate stack is just an example of the use of the invention. Any stack with varying topography may also utilize the invention.

In order to alleviate this problem, an anti-reflecting coating, 17, is formed between the substrate, 10, and the photoresist layer, 16. In this particular example, the coating, 17, comprises three layers, 13–15, of a silicon-containing oxide such as silicon oxynitride, each with different indices of refraction, n, ratios of silicon-to-oxynitride, x, and extinction coefficients, k. Each layer, 13–15, is formed by standard plasma deposition employing silane gas and nitrous oxide.

The indices of refraction, ratio of silicon-to-oxynitride, and extinction coefficients are varied in the three layers, 13–15, by varying the ratio of silane to nitrous oxide during the deposition according to known techniques. In this example, the three layers, 13–15, are designed to be used with a photoresist layer, 16, which is exposed to deep ultra violet light (approx. 248 nm) to create a pattern therein. Such exposure can be used to form feature sizes as small as 0.16 microns.

The first deposited layer, 13, comprises silicon oxynitride with a thickness of approximately 400 angstroms, although a thickness within the range 350 to 450 angstroms would be preferred. The ratio of silicon-to-oxynitride, $x_1$, was approximately 1.6, with a preferred range of 1.0 to 2.0. The extinction coefficient, $k_1$, was approximately 1.47, with a preferred range of 1.1 to 1.9. As known in the art, the extinction coefficient is a function of the bandgap of the material and is measured at the wavelength of the light which will expose the photoresist, 16, which in this example is 248 nm. The layer, 13 was formed with a silane to nitrous oxide ratio of approximately 1 to 1.6.

The second deposited layer, 14, comprises silicon oxynitride with a thickness of approximately 200 angstroms, although a thickness within the range 150 to 250 angstroms would be preferred. The index of refraction, $n_2$, was approximately 2.05, although an index of refraction within the range 1.95 to 2.25 is preferred. The ratio of silicon-to-oxynitride, $x_2$, was approximately 0.33, with a preferred range of 0.25 to 0.45. The extinction coefficient, $k_2$, was approximately 0.56, with a preferred range of 0.4 to 0.8. The layer, 14, was formed with a silane to nitrous oxide ratio of approximately 1 to 3.

The third deposited layer, 15, comprises silicon oxynitride with a thickness of approximately 200 angstroms, although a thickness within the range 150 to 250 angstroms would be preferred. The index of refraction, $n_3$, was approximately 1.90, although an index of refraction within the range 1.7 to 2.0 is preferred. The ratio of silicon-to-oxynitride, $x_3$, was approximately 0.20, with a preferred range of 0.1 to 0.25. The extinction coefficient, $k_3$, was approximately 0.36, with a preferred range of 0.15 to 0.3. This layer was formed with a silane to nitrous oxide ratio of approx. 1 to 5.

Deep ultra violet resists are notoriously sensitive to amine containing substrates, which can produce an interaction between the resist and the printing surface. In order to prevent this cross-linking between the photoresist layer, 16, and anti-reflection coating, 17, it may be desirable to form an additional oxynitride layer, 19, therebetween. This layer is approximately 10–20 angstroms thick, and is formed by exposing the anti-reflection coating, 17, in situ, to a nitrous oxide plasma for approximately 20 sec.

In general, it is desired to keep the reflectivity of the coating, 17, to less than 1 percent.

A similar structure can be employed when the photoresist layer, 16, is exposed to light having a wavelength of approximately 365 nm, also known in the art as "i-line" exposure. In that case, the layer, 13, had a thickness of approximately 650 angstroms, an index of refraction, $n_1$, of approximately 3.05, a ratio of silicon-to-oxynitride, $x_1$, of approximately 1.0, and an extinction coefficient, $k_1$, of approximately 1.0. Appropriate ranges in this example for layer 13 are: thickness of 550 to 750 angstroms; index of refraction of 2.75 to 3.35; silicon-to-oxynitride ratio of 0.7 to 1.6; and extinction coefficient of 0.7 to 1.6. The layer, 13, in this example was formed with a silane to nitrous oxide ratio of approximately 1:1. Tile layer, 14, had a thickness of approximately 250 angstroms, anl index of refraction, $n_2$, of approximately 2.25, a ratio of silicon-to-oxynitride, $x_2$, of approximately 0.33, and an extinction coefficient, $k_2$, of approximately 0.3. Appropriate ranges in this example for layer 14 are: thickness of 150 to 350 angstroms; index of refraction of 2.0 to 2.5; silicon-to-oxynitride ratio of 0.25 to 0.45; and extinction coefficient of 0.25 to 0.45. The layer, 14, in this example was formed with a silane to nitrous oxide ratio of approximately 1:3. The layer, 15, had a thickness of approximately 200 angstroms, an index of refraction, $n_3$, of approximately 1.85, a ratio of silicon-to-oxynitride, $x_3$, of approximately 0.20, and an extinction coefficient, $k_3$, of approximately 0.1. Appropriate ranges in this example for layer 15 are: thickness of 100 to 300 angstroms; index of refraction of 1.8 to 1.95; silicon-to-oxynitride ratio of 0.1 to 0.25; and extinction coefficient of 0.05 to 0.20. This layer was formed with a silane to nitrous oxide ratio of approximately 1:5. All specified values of refractive index and extinction coefficient are as measured at exposure wavelength.

Figure 2:
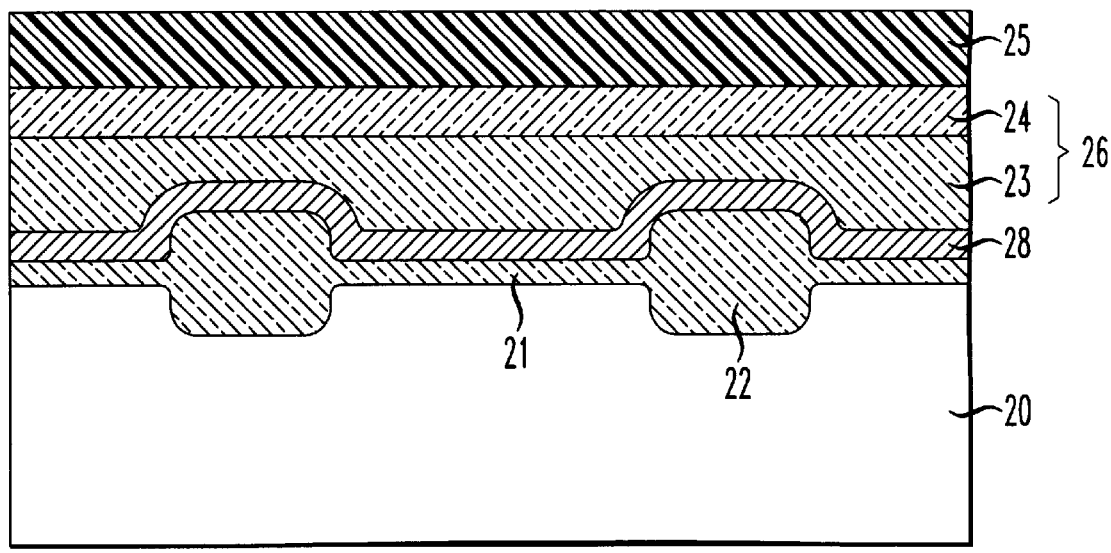
FIG. 2 is a cross sectional view of a portion of a semiconductor wafer in accordance with another embodiment of the invention.

"I-line" exposure may also utilize only two layers for the anti-reflecting coating as illustrated in FIG. 2. Here, the substrate is illustrated as 20, the thin oxide portions as 21, the thick oxide portions as 22 and the gate metal layer as 28. The anti-reflection coating, 26, consisted of two silicon oxynitride layers, 23 and 24. The coating, 26, was covered by a photoresist layer, 25, designed to be exposed to light having a wavelength of approximately 365 nm to form a pattern therein. In this example, layer 23, had a thickness of approximately 400 angstroms, although a thickness within the range 350 to 450 angstroms may be utilized. The silicon-to-oxynitride ratio, $x_1$, was approximately 1.6, the index of refraction, $n_1$, was approximately 3.31, and the extinction coefficient, $k_1$, was approximately 1.4. Suitable ranges for these parameters are: index of refraction within the range 3.0 to 3.6; silicon-to-oxynitride ratio within the range 1.2 to 2.0; and extinction coefficient within the range 0.7 to 1.6. This layer was formed with a silane to nitrous oxide ratio of approximately 8:5. The layer 24, had a thickness of approximately 350 angstroms, although a thickness within the range 300 to 400 angstroms may be utilized. The silicon-to-oxynitride ratio, $x_2$, was approximately 0.36, the index of refraction, $n_2$, was approximately 2.25, and the extinction coefficient, $k_2$, was approximately 0.3. Suitable ranges for these parameters are: index of refraction within the range 1.8 to 1.95; silicon-to-oxynitride ratio within the range 0.25 to 0.45; and extinction coefficient within the range 0.1 to 0.4. The ratio of silane to nitrous oxide used to form layer 24 was approximately 1:3.

It will be appreciated that in all these embodiments, the reflectivity is well-controlled over all substrate topologies.

While the invention has been described with reference to silicon oxynitride layers for the anti-reflection coating in a preferred embodiment, it will be appreciated that other silicon-containing oxides may be employed. In such cases, it is well within the skill of the worker in the art to determine the ratio of silicon-to-oxide needed for producing the desired indices of refraction and extinction coefficients.

What is claimed is:

1. A method for fabricating semiconductor devices comprising the steps of:

forming an antireflection coating on a non-planar surface of a semiconductor substrate, the anti-reflection coating comprising at least two layers of silicon-containing oxide with different ratios of silicon-to-oxide, different indices of refraction, and different extinction coefficients, a first layer of oxide adjacent to the substrate having an extinction coefficient within the range 0.7 to 1.9, and a second oxide layer having an index of refraction in the range 1.7 to 2.0; wherein the first layer has the highest silicon concentration of said at least two layers of silicon-containing oxide, wherein the ratio of silicon-to-oxide of the first layer of oxide is greater than the ratio of silicon-to-oxide in the second oxide layer;

forming a layer of energy-sensitive material over the coating; and exposing the energy-sensitive layer to radiation to introduce a patterned image into the energy-sensitive layer.

2. The method according to claim 1 wherein the silicon-containing oxide is silicon oxynitride.

3. The method according to claim 2 wherein the energy-sensitive layer is exposed to ultra-violet light to form the patterned image.

4. The method according to claim 3 wherein the anti-reflection coating comprises three silicon oxynitride layers, the first silicon oxynitride layer adjacent to the substrate having: a ratio of silicon-to-oxynitride within the range 1.0 to 2.0; an extinction coefficient within the range 1.1 to 1.9; and a thickness within the range 350 to 450 angstroms, the second silicon oxynitride adjacent to the energy-sensitive material having: an index of refraction in the range 1.7–2.0; a ratio of silicon-to-oxynitride within the range 0.1 to 0.25; an extinction coefficient within the range 0.15 to 0.3; and a thickness within the range 150 to 250 angstroms, and a third silicon oxynitride between the second and first silicon oxynitride having: a ratio of silicon-to-oxynitride within the range 0.25 to 0.45; an extinction coefficient within the range 0.4 to 0.8; and a thickness within the range 150 to 250 angstroms.

5. The method according to claim 4, wherein the first silicon oxynitride layer is formed by a plasma including a ratio of silane to nitrous oxide of 1 to 1.6, the second silicon oxynitride is formed by a plasma including a ratio of silane to nitrous oxide of 1 to 5, and the third silicon oxynitride layer is formed by a plasma including a ratio of silane to nitrous oxide having a ratio of 1 to 3.

6. The method according to claim 2 wherein the energy-sensitive layer is subject to I-line exposure to form the patterned image.

7. The method according to claim 6 wherein the anti-reflection coating consists of two silicon oxynitride layers, the first silicon oxynitride layer adjacent to the substrate having: an index of refraction within the range 3.0 to 3.6; a ratio of silicon-to-oxynitride within the range 1.2 to 2.0; an extinction coefficient within the range 0.7 to 1.6; and a thickness within the range 350 to 450 angstroms, and the second silicon oxynitride layer having: an index of refraction within the range 1.8 to 1.95; a ratio of silicon-to-oxide within the range 0.25 to 0.45; an extinction coefficient within the range 0.1 to 0.4; and a thickness within the range 300 to 400 angstroms.

8. The method according to claim 7, wherein the first silicon oxynitride layer is formed by a plasma including a ratio of silane to nitrous oxide having a ratio of 8 to 1, and the second silicon oxynitride is formed by a plasma including a ratio of silane to nitrous oxide having a ratio of 1 to 3.

9. The method according to claim 6 wherein the antireflection coating comprises three silicon-containing oxide layers, the first silicon-containing oxide layer adjacent to the substrate having: an index of refraction within the range 2.75 to 3.35, a ratio of silicon-to-oxynitride within the range 0.7 to 1.6; an extinction coefficient within the range 0.7 to 1.6; and a thickness within the range 550 to 750 angstroms, the second silicon-containing oxide adjacent to the energy sensitive material having: an index of refraction within the range 1.8 to 1.95; a ratio of silicon-to-oxynitride within the range 0.1 to 0.25; an extinction coefficient within the range 0.05 to 0.20; and a thickness within the range 100 to 300 angstroms, and a third silicon-containing oxide between the second and first silicon-containing oxide having: an index of refraction within the range 2.0 to 2.5; a ratio of silicon-to-oxide within the range 0.25 to 0.45; an extinction coefficient within the range 0.25 to 0.45; and a thickness within the range 150 to 350 angstroms.

10. The method according to claim 9 wherein the first silicon oxynitride layer is formed by a plasma including a ratio of silane to nitrous oxide of 1 to 1, the second silicon oxynitride is formed by a plasma including a ratio of silane to nitrous oxide of 1 to 5, and the third silicon oxynitride layer is formed by a plasma including a ratio of silane to nitrous oxide of 1 to 3.

11. The method according to claim 1 wherein the thickness of the first oxide layer is at least 350 angstroms.

12. The method according to claim 1 further comprising the step of depositing an additional oxide layer over the anti-reflection coating by means of a nitrous oxide plasma prior to forming the energy-sensitive layer.

13. The method according to claim 12 wherein the additional oxide layer has a thickness within the range 10–20 angstroms.

14. The method according to claim 1 wherein the anti-reflection coating comprises three layers of silicon-containing oxide.

* * * * *